United States Patent
Uriu et al.

(10) Patent No.: US 6,750,737 B2
(45) Date of Patent: Jun. 15, 2004

(54) HIGH FREQUENCY SWITCH AND RADIO COMMUNICATION APPARATUS WITH LAYERED BODY FOR SAW FILTER MOUNTING

(75) Inventors: Kazuhide Uriu, Katano (JP); Keiji Onishi, Settsu (JP); Toru Yamada, Katano (JP); Toshio Ishizaki, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/262,375

(22) Filed: Sep. 30, 2002

(65) Prior Publication Data

US 2003/0085774 A1 May 8, 2003

(30) Foreign Application Priority Data

Oct. 2, 2001 (JP) ........................................ 2001-306116

(51) Int. Cl.[7] ............................. H03H 9/72; H03H 9/64
(52) U.S. Cl. ....................................... 333/133; 333/193
(58) Field of Search ........................... 333/133, 193–196

(56) References Cited

U.S. PATENT DOCUMENTS

| | | | | |
|---|---|---|---|---|
| 5,699,027 A | * | 12/1997 | Tsuji et al. | 333/193 |
| 5,859,473 A | * | 1/1999 | Ikata et al. | 257/723 |
| 5,874,869 A | * | 2/1999 | Ueda et al. | 333/193 |
| 6,424,233 B1 | * | 7/2002 | Tonegawa et al. | 333/133 |
| 6,445,262 B1 | * | 9/2002 | Tanaka et al. | 333/133 |
| 6,456,172 B1 | * | 9/2002 | Ishizaki et al. | 333/133 |
| 6,469,593 B2 | * | 10/2002 | Nishizawa et al. | 333/133 |
| 6,483,399 B1 | * | 11/2002 | Atokawa | 333/133 |

FOREIGN PATENT DOCUMENTS

| | | |
|---|---|---|
| JP | 2001-211097 | 8/2001 |
| JP | 2002-118486 | 4/2002 |

* cited by examiner

*Primary Examiner*—Barbara Summons
(74) *Attorney, Agent, or Firm*—RatnerPrestia

(57) ABSTRACT

A layered body of a SAW filter includes a surface dielectric layer having a surface layer electrode pattern formed thereon, and a first dielectric layer having a pair of electrode patterns and a first ground electrode pattern formed thereon. A pair of balanced output terminals of SAW filters of unbalanced input-balanced output are connected respectively to the pair of electrode patterns via the surface layer electrode pattern, and a part of the first ground electrode pattern is disposed between the pair of the electrode patterns.

11 Claims, 8 Drawing Sheets

HIGH FREQUENCY SWITCH AND RADIO COMMUNICATION APPARATUS WITH LAYERED BODY FOR SAW FILTER MOUNTING

BACKGROUND OF THE INVENTION

1. Field of the Invention

The present invention relates to a layered body of mounting a SAW filter, a high frequency switch, and a radio communication apparatus, which are used for a mobile phone and so on, for example.

2. Related Art of the Invention

In recent years, in view of the increasing number of users of mobile communication and globalization of a system, for example, high frequency switches have received attention. The high frequency switches are provided for using systems of EGSM (Enhanced-Global System for Mobile Communication) DCS (Digital Cellular System), and PCS (Personal Communications Services), which have corresponding frequency bands of FIG. 7, in a single mobile phone and so on. Besides, FIG. 7 is an explanatory drawing showing the corresponding frequency bands of EGSM, DCS, and PCS.

Referring now to FIG. 8, which is a block diagram showing a conventional high frequency switch, the following will discuss the configuration and operation of the conventional high frequency switch used for a mobile phone and so on.

A conventional high frequency switch 800 is provided for triple bands (the above-mentioned EGSM, DCS, and PCS) that comprises transmit-receive switch circuits 801 and 802, a branching filter circuit 803 for connecting the transmit-receive switch circuits 801 and 802 to an antenna (ANT), and low-pass filters 804 and 805 of suppressing high-frequency distortion during transmission. Further, band-pass filters 806, 807, and 808 are connected to a receiving end to extract only a desired frequency band, and a packaged SAW filter is mainly used as a band-pass filter.

The conventional high-frequency switch 800 generally uses PIN diodes as the transmit-receive switch circuits 801 and 802. Inductors and capacitors constituting the transmit-receive switch circuits 801 and 802, the branching filter circuit 803, the low-pass filters 804 and 805 are formed as internal layers serving as electrode patterns in a layered body or a remounted on a surface layer by using chip components. Thus, the branching filter circuit 803, the transmit receive switch circuits 801 and 802, and the low-pass filters 804 and 805 are realized as a single lamination device.

However, a SAW filter and the high-frequency switch 800 on a receiving end need to be connected on a main substrate. On this account, it is necessary to obtain a sufficiently wide packaging area, so that it is difficult to miniaturize mobile phones.

Further, it is considered that a conventionally packaged SAW filter is mounted on a surface layer of the high-frequency switch 800. However, since a packaged SAW filter has a large size of about 3 mm square and has a height of about 1 mm, it has been difficult to achieve a small and low high-frequency switch.

SUMMARY OF THE INVENTION

Moreover, it is considered that a SAW filter such as a bare chip is mounted on a surface layer. However, in this case, it is necessary to obtain grounding strength as that of a conventional package of a SAW filter, and a balance characteristic deteriorates. Thus, it has been difficult to realize such a configuration.

In view of the above-described problems, in order to mount a SAW filter on a surface layer of a high-frequency switch and to achieve a low-profile device, the present invention has as its object the provision of small and low-profile layered body of mounting a SAW filter, high-frequency switch, and radio communication apparatus whereby grounding strength can be sufficiently obtained in the high-frequency switch to a degree which has been conventionally obtained in a package, and preferred characteristics are achieved without deterioration in balance characteristic.

One aspect of the present invention is a layered body of mounting at least one SAW filter comprising:
  a surface dielectric layer having a surface layer electrode pattern formed thereon, and
  a first dielectric layer having a pair of electrode patterns and a first ground electrode pattern formed thereon,
  wherein a pair of balanced output terminals of the SAW filter of unbalanced input-balanced output are to be connected respectively to the pair of electrode patterns via the surface layer electrode pattern, and
  a part of the first ground electrode pattern is disposed between the pair of the electrode patterns.

Another aspect of the present invention is a layered body of mounting at least one SAW filter comprising:
  a surface dielectric layer having a surface layer electrode pattern formed thereon, and
  a first dielectric layer having a pair of electrode patterns and a first ground electrode pattern formed thereon,
  wherein a pair of balanced output terminals of the SAW filter of unbalanced input-balanced output are to be connected respectively to the pair of electrode patterns via the surface layer electrode pattern, and
  a part of the first ground electrode pattern is disposed on both sides of the pair of electrode patterns.

Still another aspect of the present invention is a high-frequency switch having a plurality of signal paths corresponding to a plurality of frequency bands,
  the high-frequency switch, comprising:
    a branching filter circuit which combines transmitted signals from the plurality of signal paths during transmission and distributes received signals to the plurality of signal paths during reception,
    a plurality of transmit-receive switch circuits of switching the plurality of signal paths to a transmitting part and a receiving part, and
    a plurality of filters disposed in the signal paths,
  wherein at least one of a strip line and a capacitor which constitute the branching filter circuit, the plurality of transmit-receive switch circuits, and the plurality of filters is formed as an electrode in a layered body,
  at least one of the plurality of filters is constituted by the SAW filter,
  the SAW filter is mounted on a surface of the layered body, and
  the layered body is a layered body of mounting a SAW filter.

Yet still another aspect of the present invention is the high-frequency switch, further comprising one or more second ground electrode patterns in the layered body.

wherein the first dielectric layer is disposed directly under a surface layer of a dielectric layer formed on the surface layer of the layered body, and the first ground electrode pattern is electrically connected to the second ground electrode pattern formed on a back of a first external terminal electrode disposed on a lowest surface of the layered body or to a third ground electrode pattern formed between the first ground electrode pattern and the second ground electrode pattern through a first via hole electrode.

Still yet another aspect of the present invention is the high-frequency switch, wherein the first via hole electrode of electrically connecting the first ground electrode pattern and the second ground electrode pattern is disposed at least on each corner of the first ground electrode pattern.

A further aspect of the present invention is the high-frequency switch, wherein the first via hole electrode is larger in diameter than a second via hole electrode of connecting the strip line and the capacitor electrode which constitute the branching filter circuit, the plurality of transmit-receive switch circuits, and the plurality of filters.

A still further aspect of the present invention is the high-frequency switch, wherein of the strip lines and the capacitor electrode which constitute the branching filter circuit, the plurality of transmit-receive switch circuits, and the plurality of filters, an electrode pattern formed in the layered body is disposed on a dielectric layer between the first ground electrode and the second ground electrode.

A yet further aspect of the present invention is the high-frequency switch, wherein the surface electrode pattern has a first surface layer electrode pattern electrically connected to a ground electrode terminal of the SAW filter, an the first ground electrode pattern is electrically connected to the first surface layer electrode pattern through the first via hole electrode.

A still yet further aspect of the present invention is the high-frequency switch, wherein the first ground electrode pattern is partially connected to the second or third ground electrode pattern through the first via hole electrode.

An additional aspect of the present invention is a radio communication apparatus, comprising:

a high-frequency switch, a transmitting circuit of outputting a transmitted signal to the high-frequency switch, and a receiving circuit of inputting a received signal from the high-frequency switch.

DESCRIPTION OF SYMBOLS

800 high-frequency switch
801, 802 transmit-receive switch circuit
803 branching filter circuit
804, 805 low-pass filter (LPF)
806, 807, 808 band-pass filter (BPF)

PREFERRED EMBODIMENTS OF THE INVENTION

Figure 1:
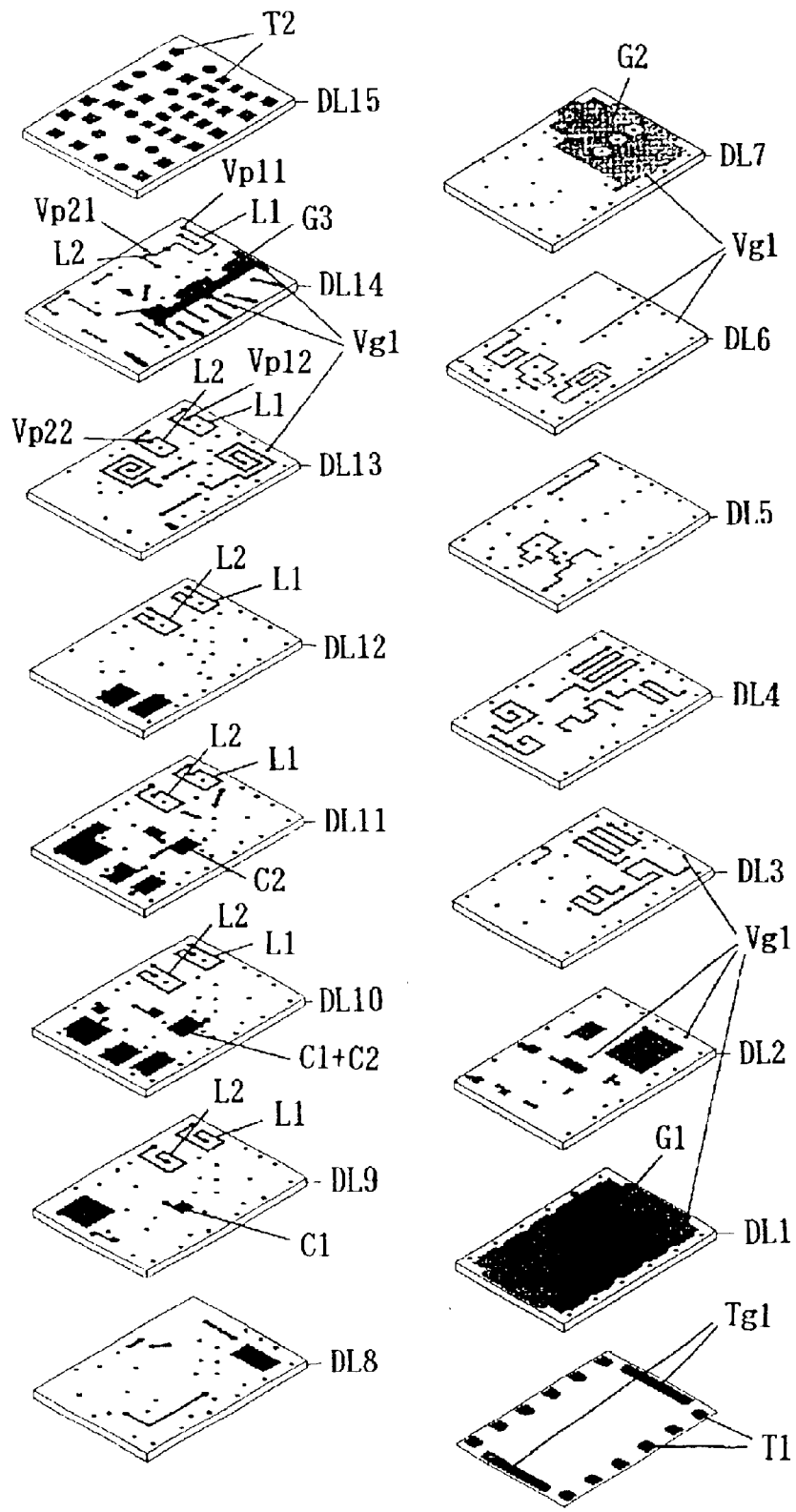
FIG. 1 is an exploded perspective view showing a high-frequency switch according to an embodiment of the present invention.
Figure 2:
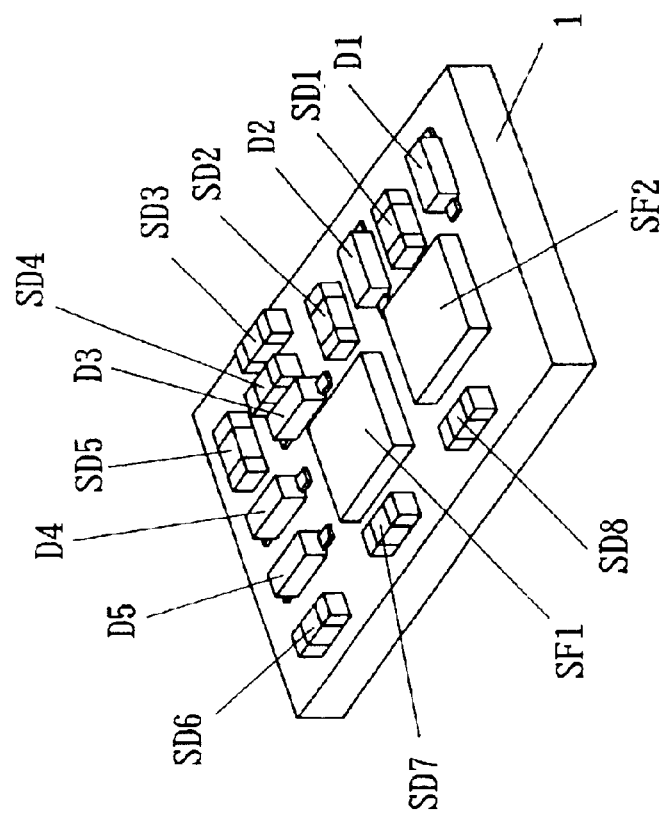
FIG. 2(a) is an explanatory drawing showing the high-frequency switch (front) according to the embodiment of the present invention.
FIG. 2(b) is an explanatory drawing showing the high-frequency switch (back).
Figure 2:
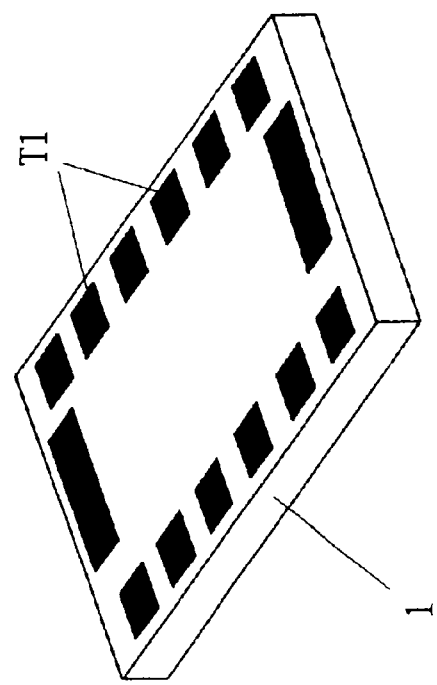

The following will discuss an embodiment of the present invention in accordance with the accompanied drawings. First, referring to FIGS. 1 and 2, the configuration of a high-frequency switch will be discussed according to the present embodiment. FIG. 1 is an exploded perspective view showing the high-frequency switch of the present embodiment (the back of a dielectric layer DL1 is shown under the dielectric layer DL1 in FIG. 1) FIG. 2(a) is an explanatory drawing showing the high-frequency switch (front) of the present embodiment. FIG. 2(b) is an explanatory drawing showing the high-frequency switch (back) of the present embodiment.

In FIG. 1, the high-frequency switch of the present embodiment is constituted by 15 dielectric layers DL1 to DL15. The number of stacked dielectric layers is properly selected according to necessary characteristics of the high-frequency switch.

Besides, as the dielectric layer, a so-called glass ceramic substrate is applicable, in which low-melting glass frit is mixed with ceramic powder such as a compound having forsterite or alumina as a main component. Further, on green sheets formed by slurry obtained by mixing an organic binder and an organic solvent with the ceramic powder, a number of via holes which electrically connect multilayer wiring are bored by mechanical punching or laser beam machining.

Printing is carried out by using conductive paste having silver (gold or copper) powder as a main component of a conductor to form wiring patterns on a predetermined green sheet, and conductive paste is printed and filled in the via holes which make interlayer connection between the wiring patterns of the green sheets. Thus, the strip lines and capacitor electrodes are formed.

The fifteen layers of green sheets obtained thus are accurately aligned, the dielectric layers DL1 to DL15 are stacked in order, and the layers are increased in temperature and pressure under a certain condition, so that an integrated layered body can be obtained. After the layered body is dried, the organic binder in the green sheet is burned out by performing burning at 400 to 500° C. in a kiln in an oxidizing atmosphere. As a main component of the conductor, burning is carried out around at 850 to 950° C. (1) in ordinary air when gold or silver powder is used and (2) in an inert gas or reduction atmosphere when copper powder is used. In this manner, a final layered body 1 can be obtained.

As shown in FIG. 2, on the upper surface of a layered body 1, which has a lamination structure including various strip lines and capacitors that constitute the high frequency switch, SAW filters SF1 and SF2 of unbalanced input-balanced output, diodes D1 to D5, and chip components SD1 to SD8 such as a capacitor and a resistor are mounted via terminals T2, which are formed on the upper surface of the layered body 1, and are electrically connected to an internal circuit of the layered body 1.

A plurality of terminals T1, which surface-mount the high-frequency switch on a main substrate of electronic equipment, is formed on the back of the dielectric layer DL1. Here, the terminals T1 and T2 are formed by printing and patterning the above-mentioned conductive paste.

Referring to some examples, the following will discuss the layered structure of the wiring patterns in the high frequency switch having such a lamination structure. Ground electrodes G1, G2, and G3 are formed on the first, seventh, and fourteenth dielectric layers DL1, DL7, and DL14 by printing and so on, the second to fourteenth dielectric layers DL2 to DL14 are properly arranged such that via hole electrodes Vg1 electrically connect the ground electrodes G1, G2, and G3. Moreover, a ground terminal electrode Tg1 of the terminals T1, which are placed on the back of the first dielectric layer DL1, and the ground electrode G1 similarly make electrical connection via the via hole electrodes Vg1.

Further, a strip line electrode pattern on the fourteenth dielectric layer DL14 makes interlayer connection with a strip line electrode pattern on the thirteenth dielectric layer DL13 through via holes Vp11 and Vp21. Moreover, the strip line electrode pattern on the thirteenth dielectric layer DL13 makes interlayer connection with a strip line pattern on the twelfth dielectric layer DL12 through via holes Vp12 and Vp22. In this manner, for example, strip lines L1 and L2 are connected sequentially through the six layers of the ninth to fourteenth dielectric layers DL9 to DL14 respectively through the via hole electrodes.

Also, capacitors C1 and C2 are connected in series by providing an electrode pattern of a capacitor C1 on the eleventh dielectric layer DL11, an electrode pattern shared by capacitors C1 and C2 on the tenth dielectric layer DL10, and an electrode pattern of the capacitor C2 on the ninth dielectric layer DL9.

Figure 3:
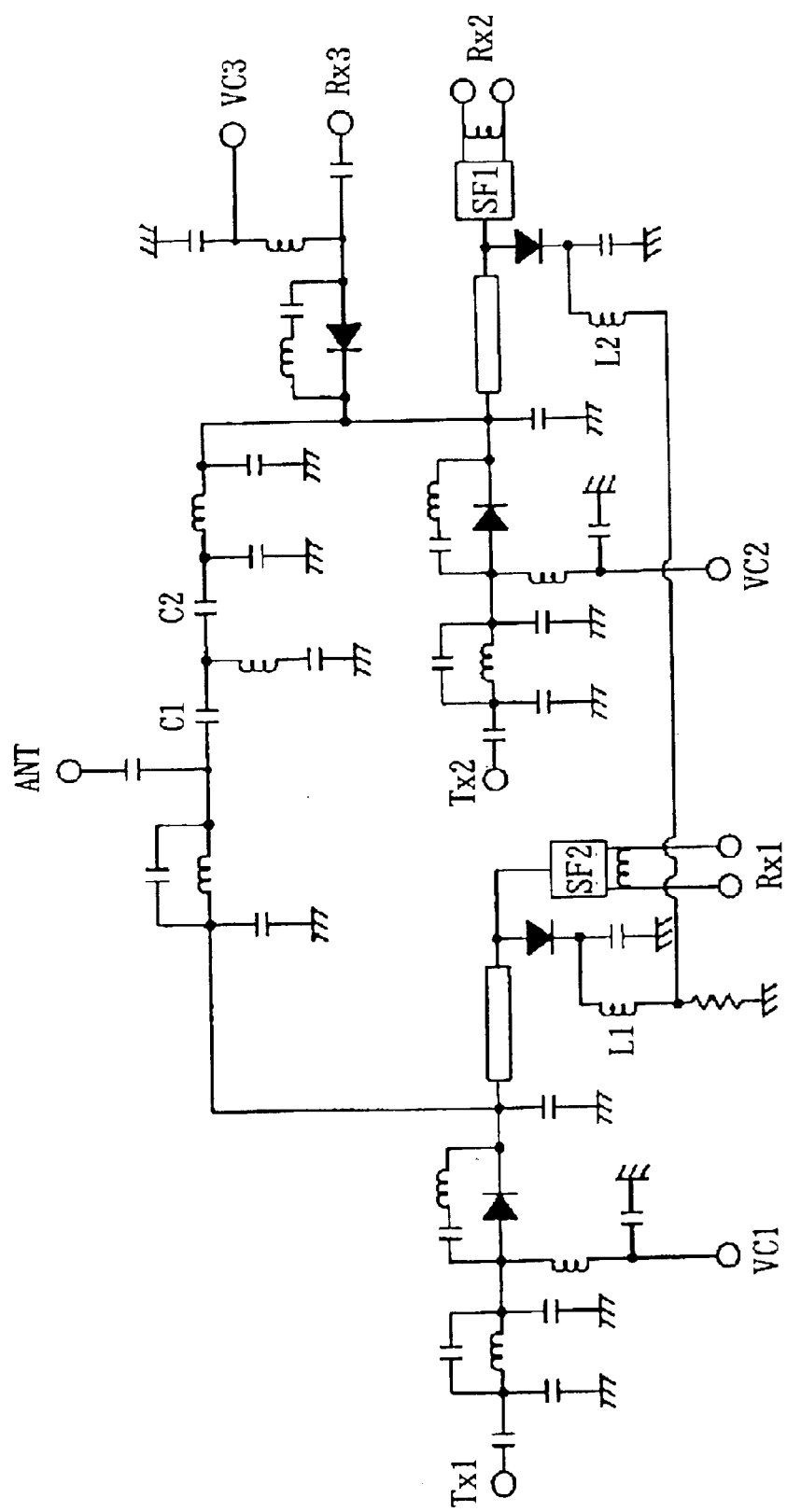
FIG. 3 is a circuit diagram showing the high-frequency switch according to the embodiment of the present invention.

Similarly, the strip line electrode patterns, the capacitor electrode patterns, and the via hole electrodes are properly arranged and are electrically connected to a diode and so on mounted on the surface layer of the layered body 1 in a suitable manner, so that a high-frequency switched circuit of FIG. 3 is configured on the layered body 1. Here, the strip lines L1 and L2 and the capacitors C1 and C2 of FIG. 1 correspond to the inductors and capacitors of FIG. 3.

The strip lines and capacitors are configured thus. The input/output terminals of the high frequency switch of the present embodiment are all gathered on the back of the first dielectric layer DL1 through the via holes. Thus, a mounting area can be small when the switch is mounted on the main substrate of electronic equipment.

Figure 4:
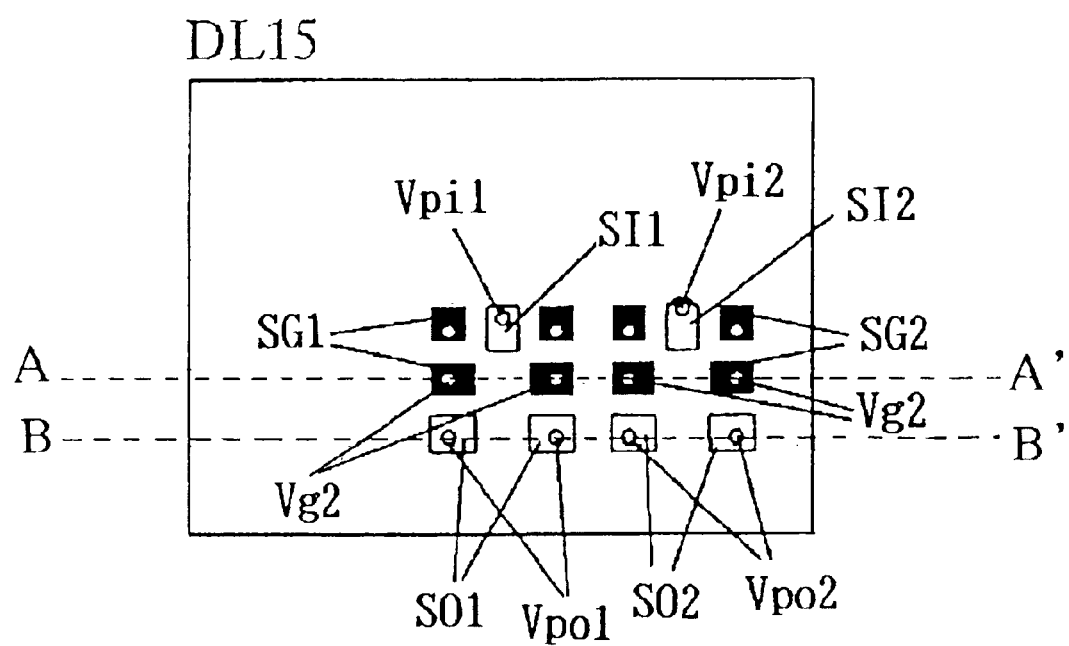
FIG. 4(a) is a plan view showing a fifteenth dielectric layer of the high-frequency switch according to the embodiment of the present invention.
FIG. 4(b) is a plan view showing a fourteenth dielectric layer of the high-frequency switch according to the embodiment of the present invention.
FIG. 4(c) is a sectional view taken along line AA' of FIGS. 4(a) and 4(b).
FIG. 4(d) is a sectional view taken along line BB' of FIGS. 4(a) and 4(b).
Figure 4:
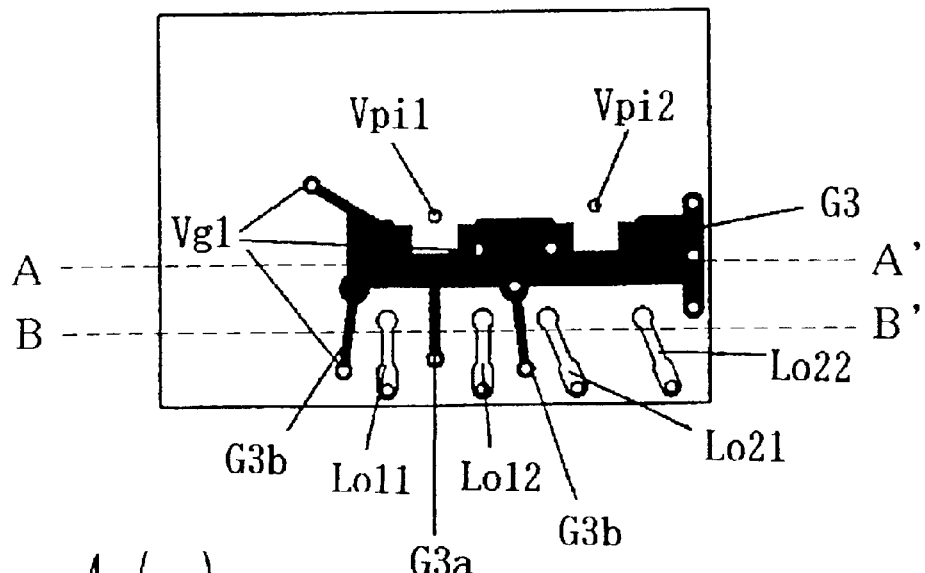
Figure 4:
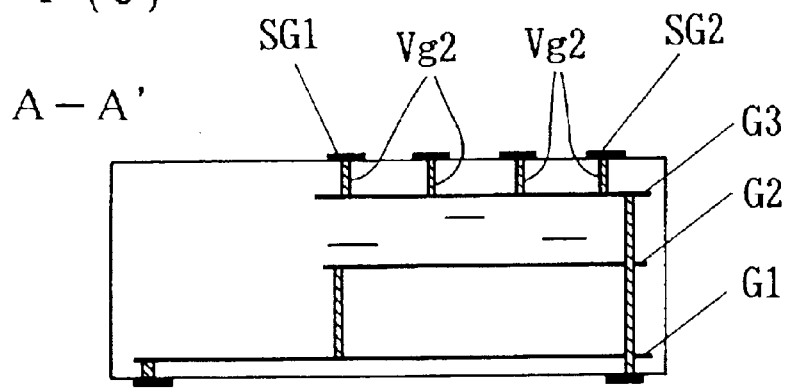
Figure 4:
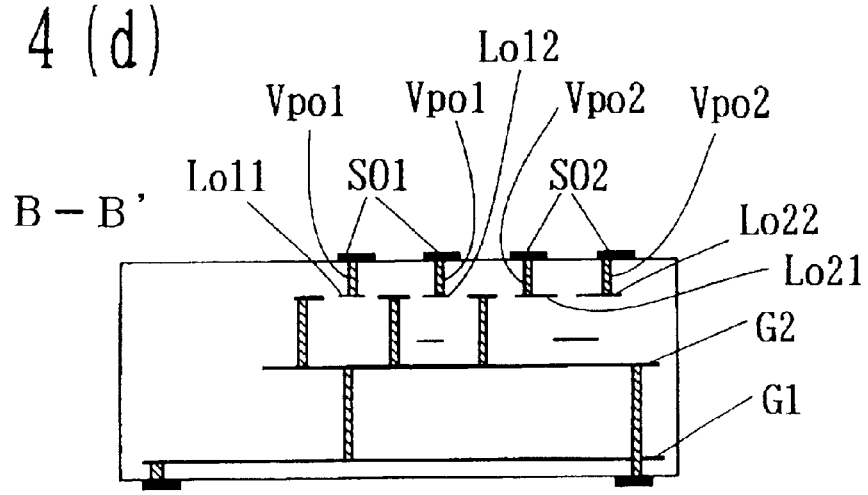

Referring to FIGS. 4(a), 4(b), 4(c), and 4(d), the following will more specifically discuss the configuration of the high-frequency switch of the present invention. Here, FIG. 4(a) is a plan view showing the fifteenth dielectric layer DL15 of FIG. 1, and FIG. 4(b) is a plan view showing the fourteenth dielectric layer DL14 of FIG. 1. Further, FIG. 4(a) only shows a part of mounting the SAW filter, and the other surface layer electrode patterns are omitted for simplification. Similarly, FIG. 4(b) only shows a part connected to a surface layer electrode pattern of FIG. 4(a). Moreover, FIG. 4(c) is a sectional view taken along line AA' of FIGS. 4(a) and 4(b), and FIG. 4(d) is a sectional view taken along line BB' of FIGS. 4(a) and 4(b).

In FIG. 4(a), surface layer ground electrode patterns SG1 and SG2 are electrically connected to ground electrodes (not shown) of the SAW filters SF1 and SF2 by solder mounting, flip chip mounting, and so on when the SAW filters SF1 and SF2 of unbalanced input-balanced output are mounted on the surface layer. Besides, the surface layer ground electrode patterns SG1 and SG2 are electrically connected to a ground electrode G3 formed on the fourteenth dielectric layer DL14 of FIG. 4(b) through via hole electrodes Vg2 provided on the fifteenth dielectric layer DL15.

Moreover, surface layer input electrode patterns S11 and S12 are connected from the internal circuit through via hole electrodes Vpi1 and Vpi2 and are electrically connected to the input terminals (not shown) of the SAW filters SF1 and SF2.

Similarly, the output terminals (not shown) of the SAW filters SF1 and SF2 are electrically connected to surface layer output electrode patterns SO1 and SO2, and the surface layer output electrode patterns SO1 and SO2 are connected to output electrode patterns Lo11, Lo12, Lo21, and Lo22, which are formed on the fourteenth dielectric layer DL14, respectively through via hole electrodes Vpo1 and Vpo2.

The ground electrode G3 formed on the fourteenth dielectric layer DL14 has an electrode pattern which makes connection to all of the via hole electrodes Vg2, and the ground electrode G3 is properly connected to the ground electrodes G1 and G2 of FIG. 1 through the via hole electrodes Vg1.

In this way, connection is made from the surface layer ground electrode pattern formed on the surface layer to the common ground electrode through short wiring, so that the influence of parasitic components can be reduced, achieving a preferable attenuation characteristic. Furthermore, the via hole electrodes Vg1 and Vg2 electrically connecting the ground electrodes are larger in diameter than the other via hole electrodes (Vpi1, Vpi2, Vpo1, Vpo2, etc.), so that parasitic components caused by the via hole electrodes can be further reduced, achieving a more preferable attenuation characteristic. Namely, it is possible to obtain high grounding strength. Here, electrical grounding strength means an electrical grounding state and is simply referred to as grounding strength. Further, an electrically ideal grounding state means a potential of 0, low grounding strength means a state away from the ideal grounding state, and high grounding strength means a state close to an ideal grounding state.

Further, a part G3a of the ground electrode G3 is disposed between the output electrode patterns Lo11 and Lo12. Moreover, a part G3b of the ground electrode G3 is disposed on both sides of the output electrode patterns Lo11 and Lo12. Besides, connection is properly made to the ground electrodes G1 and G2 from the parts G3a and G3b of the ground electrode through the via hole electrodes Vg1.

Figure 5:
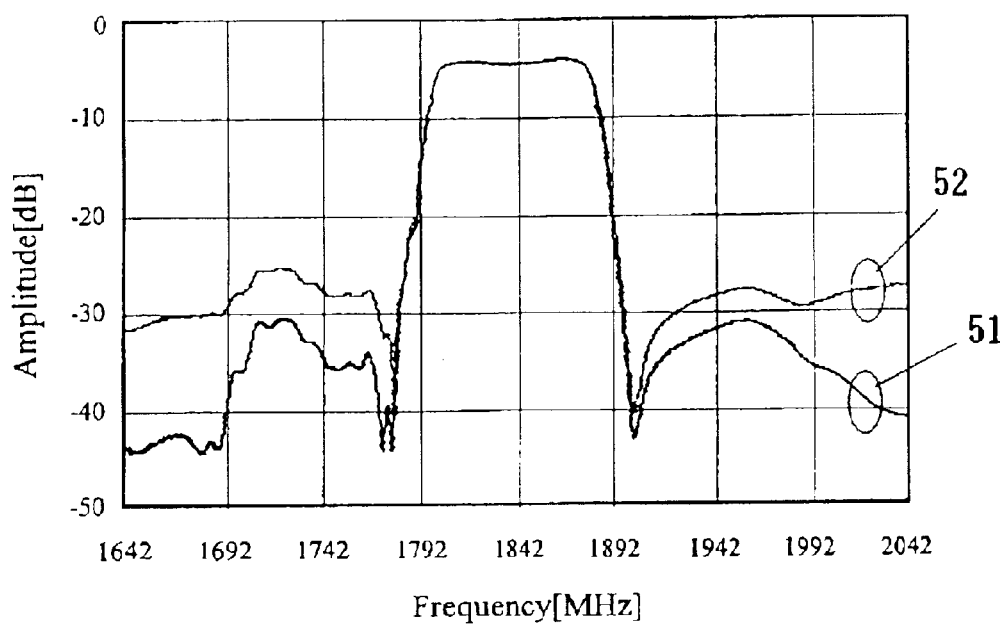
FIG. 5 is a diagram showing a passing property of Ant→Rx2 of the high frequency switch according to the embodiment of the present invention.
Figure 6:
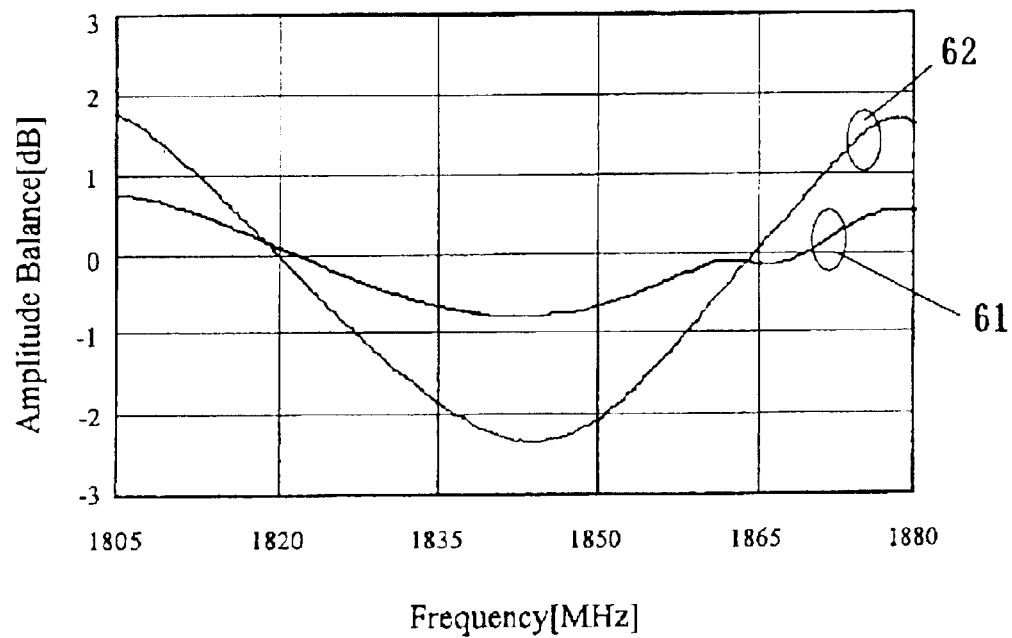
FIG. 6 is a diagram showing an amplitude balance characteristic during passage of Ant→Rx2 of the high-frequency switch according to the embodiment of the present invention.
Figure 7:
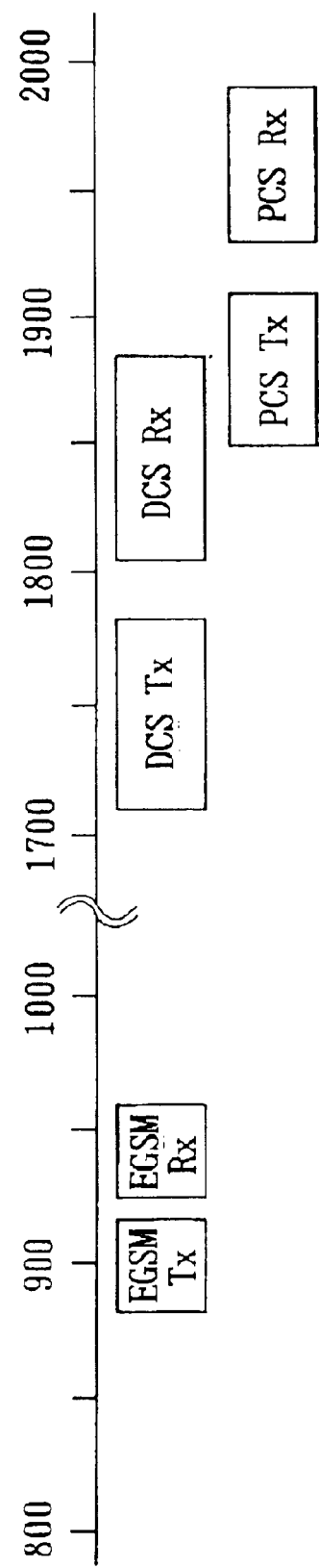
FIG. 7 is an explanatory drawing showing corresponding frequency bands of EGSM, DCS, and PCS.
Figure 8:
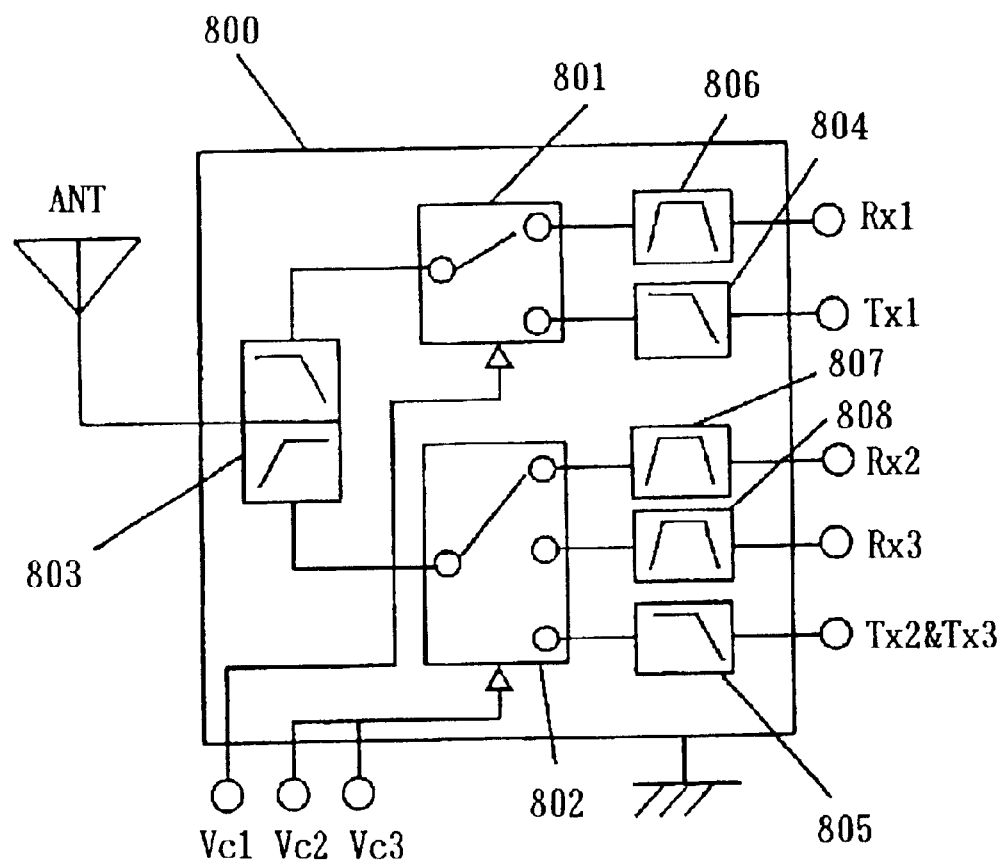
FIG. 8 is a block diagram showing a conventional high-frequency switch.

FIG. 5 shows a passing property from Ant to DCS-Rx (Rx2 in FIG. 3), and FIG. 6 shows a balance characteristic of amplitude at this moment. 51 of FIG. 5 and 61 of FIG. 6 indicate characteristics of a configuration in which the parts G3a and G3b of the ground electrode G3 are disposed on the fourteenth dielectric layer DL14 and are properly connected to the ground electrodes G1 and G2 through the via hole electrodes Vg1. 52 of FIG. 5 and 62 of FIG. 6 indicate characteristics of a configuration in which the parts G3a and G3b of the ground electrode are not disposed.

In this way, since the parts of the ground electrode are disposed between the output electrode patterns, it is possible to obtain preferable characteristics without deteriorating the attenuation characteristic and balance characteristic of the SAW filters of unbalanced input-balanced output that are mounted on the surface layer. Further, since the parts of the ground electrode are disposed on both sides of the output pattern, it is possible to further obtain a preferable property.

Moreover, when the high-frequency switch of the present embodiment is used for a mobile phone and so on, mounting is made on a main substrate constituting a radio circuit. In this case, since the layered body and the SAW filters are combined, it is possible to considerably reduce a mounting area, thereby achieving a small and low-profile mobile phone.

Besides, the present embodiment discussed an example in which two SAW filters are mounted. The same effect can be obtained when a single SAW filter is mounted and when three or more SAW filters are mounted.

Besides, the present embodiment discussed an example in which the combination of three systems of EGSM, DCS, and PCS is used. Combination of the other systems such as EGSM, DCS, and UMTS (Universal Mobile Telecommunications System) can be similarly used.

Also, the present embodiment discussed an example of the triple-band high-frequency switch using three communication systems. By changing the configuration of the switched circuit, the same effect can be obtained in the case of a dual-band high-frequency switch using two communication systems (e.g., EGSM and UMTS) and in the case of a high-frequency switch using four or more systems (e.g., EGSM, AMPS (Advanced Mobile Phone Service), DCS, and PCS).

Additionally, the present embodiment discussed an example in which a diode is used as a switched circuit. The same effect can be obtained in the case where a GaAs switch is used as one of the switched circuits and in the case where GaAs switches are used as both of the switched circuits.

Also, the present embodiment discussed the case where the SAW filters of CSP type are mounted. The configuration is not limited to the above, and SAW filters of bare chip type may be mounted. When SAW filters of bare chip type are mounted, it is preferable to have wide intervals of surface electrode terminals and so on which mount the SAW filters shown in FIGS. 4(a) and 4(b). In this way, with wide intervals of the surface layer electrode terminals and so on, the present embodiment can also mount the SAW filters of bare chip type.

Besides, the present embodiment discussed that the part G3a of the ground electrode G3 is disposed between the output electrode patterns Lo11 and Lo12 and the part G3b of the ground electrode G3 is disposed on both sides of the output electrode patterns Lo11 and Lo12. The configuration is not limited to the above. The part G3a of the ground electrode G3 may be disposed between the output electrode patterns Lo11 and Lo12, and the part G3b of the ground electrode G3 may not be disposed on both sides of the output electrode patterns Lo11 and Lo12. In this case, it is possible to obtain a high-frequency switch having a preferable attenuation characteristic. Further, the part G3a of the ground electrode G3 may not be disposed between the output electrode patterns Lo11 and Lo12, or the part G3b of the ground electrode may be disposed on both sides of the output electrode patterns Lo11 and Lo12. In this case, it is possible to obtain a high-frequency switch having a preferable balancing characteristic.

As is evident from the above explanation, the present invention makes it possible to provide a layered body of mounting a SAW filter, a high-frequency switch, and a radio communication apparatus whereby the SAW filter is mounted on a layered body, a small and low-profile lamination device is achieved, and a preferable attenuation characteristic and balance characteristic are obtained.

What is claimed is:

1. A high-frequency switch having a plurality of signal paths corresponding to a plurality of frequency bands, the high-frequency switch, comprising:
a branching filter circuit which combines transmitted signals from the plurality of signal paths during transmission and distributes received signals to the plurality of signal paths during reception,
a plurality of transmit-receive switch circuits of switching the plurality of signal paths to a transmitting part and a receiving part, and
a plurality of filters disposed in the signal paths,
wherein at least one of a strip line and a capacitor which constitute the branching filter circuit, the plurality of transmit-receive switch circuits, and the plurality of filters is formed as an electrode in a layered body,
at least one of the plurality of filters is constituted by the SAW filter,
the SAW filter is mounted on a surface of the layered body, and
the layered body is a layered body of mounting at least one SAW filter comprising:
a surface dielectric layer having a surface layer electrode pattern formed thereon, and
a first dielectric layer having a pair of electrode patterns and a first ground electrode pattern formed thereon,
wherein a pair of balanced output terminals of the SAW filter of unbalanced input-balanced output are connected respectively to the pair of electrode patterns via the surface layer electrode pattern, and
a part of the first ground electrode pattern is disposed between the pair of the electrode patterns.

2. A layered body of mounting at least one SAW filter, comprising:
a surface dielectric layer having a surface layer electrode pattern formed thereon, and
a first dielectric layer having a pair of electrode patterns and a first ground electrode pattern formed thereon,
wherein a pair of balanced output terminals of the SAW filter of unbalanced input-balanced output are connected respectively to the pair of electrode patterns via the surface layer electrode pattern, and
a part of the first ground electrode pattern is disposed on both sides of the pair of electrode patterns.

3. A high-frequency switch having a plurality of signal paths corresponding to a plurality of frequency bands, the high-frequency switch, comprising:
a branching filter circuit which combines transmitted signals from, the plurality of signal paths during transmission and distributes received signals to the plurality of signal paths during reception, a plurality of transmit-receive switch circuits of switching the plurality of signal paths to a transmitting part and a receiving part, and a plurality of filters disposed in the signal paths, wherein at least one of a strip line and a capacitor which constitute the branching filter circuit, the plurality of transmit-receive switch circuits, and the plurality of filters is formed as an electrode in a layered body, at least one of the plurality of filters is constituted by the SAW filter, the SAW filter is mounted on a surface of the layered body, and the layered body is a layered body of mounting a SAW filter according to claim 2.

4. The high-frequency switch according to claim 3 or 1, further comprising one or more second ground electrode patterns in the layered body, wherein the first dielectric layer is disposed directly under a surface layer of a dielectric layer formed on the surface layer of the layered body, and the first ground electrode pattern is electrically connected to the second ground electrode pattern formed on a back of a first external terminal electrode disposed on a lowest surface of the layered body or to a third ground electrode pattern formed between the first ground electrode pattern and the second ground electrode pattern through a first via hole electrode.

5. The high-frequency switch according to claim 4, wherein the first via hole electrode of electrically connecting the first ground electrode pattern and the second ground electrode pattern is disposed at least on each corner of the first ground electrode pattern.

6. The high-frequency switch according to claim 5, wherein the first via hole electrode is larger in diameter than a second via hole electrode of connecting the strip line and the capacitor electrode which constitute the branching filter circuit, the plurality of transmit-receive switch circuits, and the plurality of filters.

7. The high-frequency switch according to claim 4, wherein of the strip lines and the capacitor electrode which constitute the branching filter circuit, the plurality of transmit-receive switch circuits, and the plurality of filters, an electrode pattern formed in the layered body is disposed on a dielectric layer between the first ground electrode and the second ground electrode.

8. The high-frequency switch according to claim 4, wherein the first ground electrode pattern is partially connected to the second or third ground electrode pattern through the first via hole electrode.

9. The high-frequency switch according to claim 3 or 1, wherein the surface electrode pattern has a first surface layer electrode pattern electrically connected to a ground electrode terminal of the SAW filter, and the first ground electrode pattern is electrically connected to the first surface layer electrode pattern through a first via hole electrode.

10. A radio communication apparatus, comprising:

a high-frequency switch according to claim 3 or 1, a transmitting circuit of outputting a transmitted signal to the high-frequency switch, and a receiving circuit of inputting a received signal from the high-frequency switch.

11. A layered body of mounting at least one SAW filter comprising:

a surface dielectric layer having a surface layer electrode pattern formed thereon, a first dielectric layer having a pair of electrode patterns and a first ground electrode pattern formed thereon, and one or more second ground electrode patterns in the layered body, wherein a pair of balanced output terminals of the SAW filter of unbalanced input-balanced output are connected respectively to the pair of electrode patterns via the surface layer electrode pattern, a part of the first ground electrode pattern is disposed between the pair of the electrode patterns, the first dielectric layer is disposed directly under a surface layer of a dielectric layer formed on the surface layer of the layered body, and the first ground electrode pattern is electrically connected to the second ground electrode pattern formed on a back of a first external terminal electrode disposed on a lowest surface of the layered body or to a third ground electrode pattern formed between the first ground electrode pattern and the second ground electrode pattern through a first via hole electrode, and the first via hole electrode is larger in diameter than a second via hole electrode connecting a strip line and a capacitor electrode.

* * * * *